(12) United States Patent
Eklund et al.

(10) Patent No.: US 7,899,035 B2
(45) Date of Patent: Mar. 1, 2011

(54) COMMUNICATION STRUCTURE FOR SOLAR INVERTERS

(75) Inventors: Mats Eklund, Vienna (AT); Franz Hackl, Vienna (AT); Franz Reithmayer, Vienna (AT); Walter Strobl, Vienna (AT)

(73) Assignee: Siemens AG Österreich, Vienna (AT)

( * ) Notice: Subject to any disclaimer, the term of this patent is extended or adjusted under 35 U.S.C. 154(b) by 394 days.

(21) Appl. No.: 12/223,084

(22) PCT Filed: Nov. 14, 2006

(86) PCT No.: PCT/EP2006/068441
§ 371 (c)(1),
(2), (4) Date: Jul. 22, 2008

(87) PCT Pub. No.: WO2007/085310
PCT Pub. Date: Aug. 2, 2007

(65) Prior Publication Data
US 2010/0220733 A1    Sep. 2, 2010

(30) Foreign Application Priority Data
Jan. 30, 2006 (DE) .......................... 10 2006 004 233

(51) Int. Cl.
*H04L 12/66* (2006.01)
(52) U.S. Cl. .......... 370/352; 370/244; 709/208; 136/244
(58) Field of Classification Search .......... None
See application file for complete search history.

(56) References Cited

U.S. PATENT DOCUMENTS

| 6,230,224 B1 * | 5/2001 | Kim .............................. 710/110 |
| 2004/0027004 A1 | 2/2004 | Bayoumi et al. |
| 2006/0015586 A1 | 1/2006 | Sharma et al. |
| 2007/0019613 A1 * | 1/2007 | Frezzolini ..................... 370/352 |

FOREIGN PATENT DOCUMENTS

| DE | 195 04 587 A1 | 8/1996 |
| DE | 197 11 958 A1 | 9/1998 |
| DE | 198 59 732 A1 | 6/2000 |
| WO | WO 2005/117245 A1 | 12/2005 |

OTHER PUBLICATIONS

A.P.Apostolov; "Integration of Legacy Intelligent Electronic Devices in UCA Based Digital Control Systems"; 2002; pp. 647-653; IEEE Power Engineering Society, Winter Meting, Conference Proceedings, New York, NY; Jan. 27-31, 2000; IEEE Power Engineering Society; New York, NY; Alstom T&D, Los Angeles, CA, 90064 USA (e-mail: aapostolov@mediaone.net); XP010578366.

Thomas Schmidt; "Enhancing Automotive Subsystem Design With LIN—Implementing a LIN Protocol-to-CAN Gateway"; Feb. 2001, pp. 60-62, 65, No. 127, Circuit Cellar Inc., Vernon, CT, US, XP008004109, ISSN: 0896-8985.

* cited by examiner

*Primary Examiner* — Duc C Ho

(57) ABSTRACT

There is described a communication structure for at least two solar inverters, having a transmission medium by means of which each of the at least two solar inverters is connected to a communication network with a first group of the solar inverters each being connected via an LAN interface to the communication network, and with a further group of the solar inverters being connected to the first group via serial interfaces. Two different network types are therefore provided with the first being suitable for standard LAN technologies with rapid data transmission over short distances, and with the second being suitable for interference-insensitive data transmission over long distances.

14 Claims, 2 Drawing Sheets

COMMUNICATION STRUCTURE FOR SOLAR INVERTERS

CROSS REFERENCE TO RELATED APPLICATIONS

This application is the US National Stage of International Application No. PCT/EP2006/068441, filed Nov. 14, 2006 and claims the benefit thereof. The International Application claims the benefits of German application No. 10 2006 004 233.6 DE filed Jan. 30, 2006, both of the applications are incorporated by reference herein in their entirety.

FIELD OF INVENTION

The invention relates to a communication structure for at least two solar inverters, consisting of a transfer medium by means of which each of the at least two solar inverters is connected to a communication network. The invention further relates to a method for operating the communication structure.

BACKGROUND OF INVENTION

Solar inverters are used for converting the direct current delivered by solar panels into an alternating current for feeding into a public power network or into a stand-alone power network. In such cases solar inverters generally feature measurement circuits by means of which the operating status can be detected and recorded as well as featuring various configuration options. A request for measurement data (e.g. curve of the input voltage, converted energy etc.) and changes to settings (e.g. standby times) can be undertaken ether through a direct connection of a solar inverter to an input/readout device or by means of a connection to a communication network. In the latter case the input/readout device forms a node of the communication network and the data is transmitted via its physical structure. The World Wide Web is typically used as the communication network, but an Intranet or an Extranet can also be used.

According to the prior art a photovoltaic system either has a central communication facility to which all solar inverters of the installation are connected or each solar inverter includes a separate communication unit which allows a direct connection to a communication network.

Thus DE 198 59 732 A1 for example describes a photovoltaic system with a plurality of solar modules and a control center, with each solar module being assigned an inverter and each inverter being connected via an ac power line to the control center. Both data and also the energy generated by the solar modules are transmitted using a time division multiplexing method. In such cases the individual inverters can only be connected via the control center to the public power network; therefore the installation as a whole only functions if the control center is operating correctly. Data transmission in this case is only used for diagnosis of the operating state of the solar modules along with the respective inverters. Control commands (e.g. switch on/switch off) are only possible for the installation as a whole by changing the settings at the control center, there is no provision for being able to control individual solar inverters.

US 2004/0027004 A1 discloses a general communication structure for decentralized power generation units. In this case either each power generation unit or each of a number of groups of power generation units has a microcontroller, with all microcontrollers being connected to a communication network. For connection to the communication network each microcontroller has a communication unit (e.g. modem), via which communication processes are handled. Such a communication structure requires each microcontroller to be connected via at least a telephone line or a network cable to the communication network. These lines are mostly very thin and have many strands, which means that great care must be taken when laying them to avoid damaging the cable. This type of cabling of inverters for solar modules which naturally has be installed scattered in the countryside and on buildings and is often not freely accessible, is therefore associated with a certain outlay. With an Ethernet connection the length of the lines is also restricted without the corresponding repeaters.

SUMMARY OF INVENTION

An underlying object of the invention is therefore to specify a communication structure for solar inverters which represents an improvement compared to the prior art.

In accordance with the invention this object is achieved by a communication structure of the type mentioned at the start, with a first part of the solar inverters being connected in each case via a LAN interface to the communication network and with a further part of the solar inverters being connected to the first part via serial interfaces.

An advantage of this solution lies in the fact that, within a photovoltaic installation, an efficient connection is made to a communication network such as the World Wide Web for example via LAN interfaces. Above and beyond this the further part is connected to the first part via serial interfaces with a simple transfer medium (e.g. two-wire line), which is able to be installed more robustly than a telephone line or network cable and over greater distances. There are also two different network types provided, with the first being suitable for standard LAN technologies with rapid data transmission over short distances and the second being suitable for interference-insensitive data transmission over long distances.

An advantageous variant of the invention makes provision in this case for the solar inverters connected to the communication network to be embodied in each case as communication masters and for the further solar inverters to be embodied as communication slaves. The first network type is then optimized for communication between communication master and communication network and the second network type for communication between communication master and communication slaves. In this way access is possible to all solar inverters via communication devices which are embodied as nodes of the communication network. Thus on the one hand measurement or status data of each solar inverter can be retrieved and on the other hand changes can be made to settings on each solar inverter by transfer of control data. In such cases there is direct access to the first part of the solar inverters, for the further solar inverters access is in accordance with the master-slave principle via the solar inverter embodied as the communication master. In such cases either only the communication masters are embodied as Web servers or the communication slaves are also embodied as Web servers and the communication masters assume a router function.

It is further advantageous for the LAN interface to be embodied as an Ethernet interface and for the serial interface to be embodied as an EIA-485 interface. Both interfaces are very widely used and reliable, with the Ethernet interface being especially suitable for efficient communication with a communication network and the EIA-485 interface for robust connection over longer connections in the open air.

It is also of advantage for a least one standby communication master to be provided for each communication master, with said standby unit operating as the communication slave in normal operation and assuming the function of the communication master in the event of an error. The standby communication master then also has a direct LAN connection which is activated on failure of the communication master and thus continues to enable data to be exchanged with each solar inverter within the installation.

A further version of the invention provides for a router to be connected between the communication network and the communication master. A number of photovoltaic installations arranged in spatial proximity to each other can then be linked with at least one communication master per installation via a shared router to a communication network. This simplifies the communication links between the installations and brings about efficient addressing of the individual solar inverters.

Further advantages are produced if both the solar inverters of the first part and also the solar inverters of the further part are identical in construction. On the one hand this simplifies manufacturing of the solar inverters and makes the structuring of photovoltaic installations more flexible. For example all solar inverters are then able to be connected together via the serial interface and each solar inverter which is spatially the closest to the communication network connection is defined as a communication master. The definition of standby communication masters can also be easily modified in this manner.

The inventive communication structure is operated by all data transferred from the communication network via the LAN interfaces to the solar inverters embodied as communication masters being collected by these masters and by this data being sent in accordance with an address assignment to the solar inverters embodied as communication slaves. In addition the data of a solar inverter embodied as a communication slave is retrieved by the solar inverter embodied as the communication master and sent via the LAN interface to a node in the communication network. The communication master thus functions as Web server for all solar inverters, meaning that storage functions can be implemented centrally in the communication master for example. In such cases each communication master and also each communication slave can send out information by itself at any time, for example as e-mail, into the communication network.

Another method for operating the inventive communication structure provides for all data to be forwarded from the communication network via the solar inverters embodied as communication masters in accordance with an address assignment to the solar inverters embodied as communication slaves, and for the data sent from the solar inverters embodied as communication slaves to be forwarded via the assigned solar inverters embodied as communication masters to a node in the communication network. In such cases each solar inverter is active as Web server and administers its own data itself. The communication master serves as a router in this case, which distributes the data in accordance with assigned solar inverter addresses.

In both methods it is advantageous, in normal operation, for all data of the communication slaves assigned to one communication master in each case to be handled via this communication master and, on failure of this communication master, for all data to be handled via a standby communication master.

BRIEF DESCRIPTION OF THE DRAWINGS

The invention is explained below using examples which refer to the enclosed figures. The figures show the following schematic diagrams.

DETAILED DESCRIPTION OF INVENTION

Figure 1:
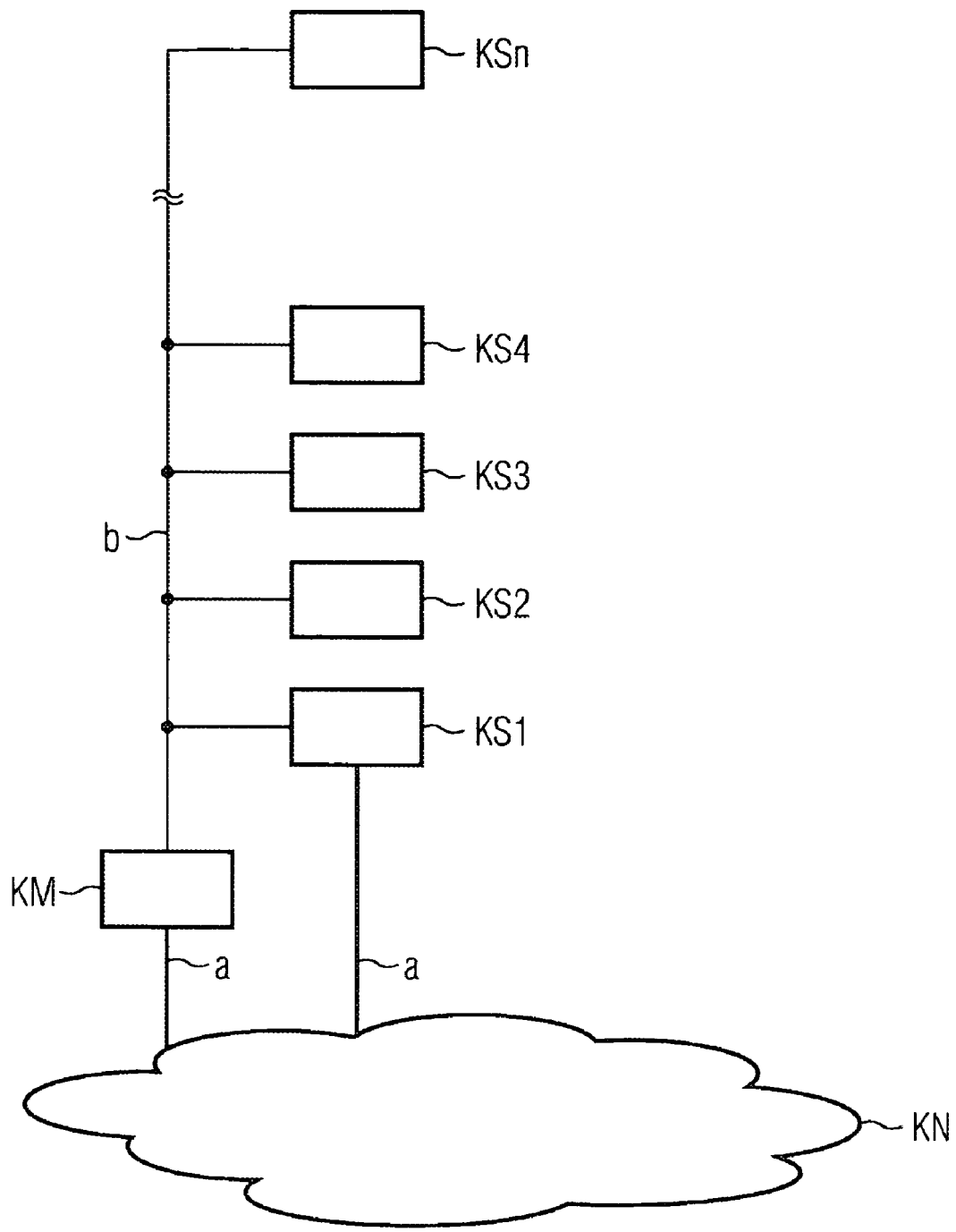
FIG. 1 the communication structure of a photovoltaic installation

FIG. 1 shows an inventive variant of a communication structure for a photovoltaic installation, with the individual solar inverters KM, KS1 . . . KSn being shown for improved clarity without the connected solar panels and without the power connections to a power network. The individual solar inverters KM, KS1 . . . KSn are for example assigned to solar panels with an output of up to 5 KW, so that an efficient installation includes a number of solar inverters in spatial proximity. The solar inverters embodied as communication slaves KS1 to KSn are connected in this case via a transfer medium b suitable for serial networks to each other via a serial interface with bus capabilities (e.g. via an EIA-485 interface). The transfer medium b suitable for serial networks can for example be a two-wire copper cable, the EIA-485 interface then operates in half-duplex mode.

In such cases for example there can be up to 100 communication slaves KS1 to KSn arranged in an installation, with the distance between the individual solar inverters able to be around 1 km. One end of the transfer medium b suitable for serial networks is with connected to the serial interface of the solar inverter embodied as communication master KM.

The solar inverter embodied as communication master KM is connected via an additional LAN interface with a transfer medium a suitable for LAN networks to a communication network KN. This transfer medium a suitable for LAN networks can for example be a network cable, with the communication master KM being connected via an Ethernet interface to the communication network KN. The communication master KM can however also be connected via a modem to the communication network KN, the transfer medium a suitable for LAN networks is then a telephone cable.

A solar inverter embodied as a communication slave KS1 is likewise switched via a LAN interface with a transfer medium a suitable for LAN networks to the communication network KN. The communication slave KS1 then serves as standby communication master, assuming the function of the communication master KM if the latter fails. To increase failsafe capabilities, further communication slaves can also be connected as standby communication masters to the communication network KN with a transfer medium a suitable for LAN networks via the LAN interface.

Figure 2:
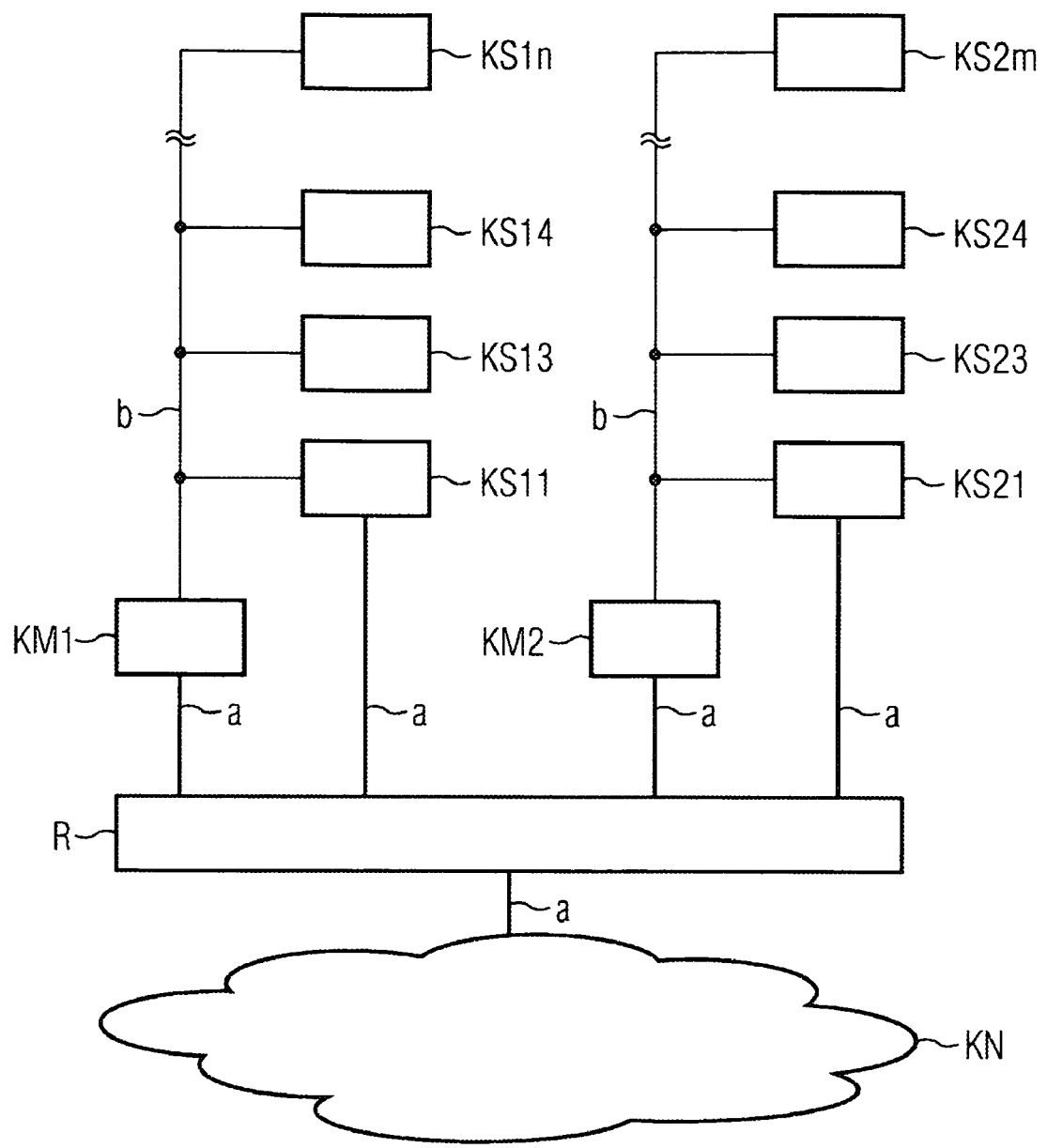
FIG. 2 the communication structure of a photovoltaic installation with two strings and a router

FIG. 2 shows is a photovoltaic installation with two strings, with each string being embodied from one solar inverter embodied as communication master KM1, KM2 with assigned solar inverters as communication slaves KS11 . . . KS1n or KS21 . . . KS2m. The same arrangement is also present with two or more photovoltaic installations set up in spatial proximity, with one or more strings in each case. Each solar inverter KM1, KM2 embodied as communication master is connected in such cases to a router R. The number of connected strings of photovoltaic installations depends in this case on the type of construction of the router R.

In the first line a communication master KM1 is linked via a LAN interface with a transfer medium a suitable for LAN networks to the router R, as is a solar inverter embodied as standby communication master KS11. All solar inverters KM1, KS11 . . . KS1n of a first string are also connected via a serial interface with a transfer medium b suitable for serial networks. The second string is arranged in the same way, with the number of solar inverters KS21 to KS2m embodied as communication slaves being able to differ from those of the first string.

The router R is connected via a further LAN interface with transfer medium a suitable for LAN networks to the communications network KN. All data is transmitted via this line between communication network KN and router R and assigned by router R to the correct communication master KM1, KM2 or, in the event of an error, to a standby communication master KS11, KS21. As a rule the assignment is undertaken in such cases via a unique address of each solar inverter with which each data block is identified.

Access from the communication network KN (e.g. Internet) to the solar inverters can take two different forms:

a) Only the communication masters KM or KM1, KM2 are accessible directly from the communication network KN. An addressed communication master KM or KM1, KM2 collects the data of the communication slaves KS1 . . . KSn or KS11 . . . KS1n, KS21 . . . KS2m via the serial interface with the transfer medium b suitable for serial networks as the connecting line. The communication slaves KS1 . . . KSn or KS11 . . . KS1n, KS21 . . . KS2m are in this way connected indirectly to the communication network KN. In this case only the Web servers of the communication masters KM or KM1, KM2 are active.

b) The communication master KM or KM1, KM2 establishes via the serial interface with the transfer medium b suitable for serial networks as the connecting line, a network connection to the communication slaves KS1 . . . KS1n or KS11 . . . KS1n, KS21 . . . KS2m in the manner in which each solar inverter is accessible directly via the communication network KN. In this case both the Web servers of the communication masters KM or KM1, KM2 and also each of the communication slaves KS1 . . . KSn or KS11 . . . KS1n, KS21 . . . KS2m is active.

It is useful to embody each solar inverter with the same construction. Each solar inverter thus includes a Web server which can be activated or deactivated. An installation is then able to be used independently of future communication requirements and each solar inverter can either assume the function of a communication master KM1 or KM2 or of a communication slave KS1 . . . KSn or KS11 . . . KS1n, KS21 . . . KS2m. In the case of the standby communication master KS11 or KS21 this means that a change between the functions is also possible in a simple manner.

The invention claimed is:

1. A solar system having a communication structure for at least two solar inverters, comprising:
communication connections to connect the solar inverters to a communication network, wherein a first part of the solar inverters is connected via a LAN interface to the communication network and wherein a further part of the solar inverters is connected to the first part via serial interfaces wherein the LAN interface is an Ethernet interface, and wherein the serial interface is an EIA-485 interface.

2. The solar system as claimed in claim 1, wherein the solar inverters connected to the communication network are communication masters, and wherein further solar inverters are communication slaves.

3. The solar system as claimed in claim 2, wherein the LAN interface is an Ethernet interface, and wherein the serial interface is an EIA-485 interface.

4. The solar system as claimed in claim 3, wherein for each communication master at least one standby communication master is provided, which operates in normal operation as communication slave and in the event of an error assumes the function of the communication master.

5. The solar system as claimed in claim 2, wherein for each communication master at least one standby communication master is provided, which operates in normal operation as communication slave and in the event of an error assumes the function of the communication master.

6. The solar system as claimed in claim 2, wherein for each communication master at least one standby communication master is provided, which operates in normal operation as communication slave and in the event of an error assumes the function of the communication master.

7. The solar system as claimed in claim 2, wherein for each communication master at least one standby communication master is provided, which operates in normal operation as communication slave and in the event of an error assumes the function of the communication master.

8. The solar system as claimed in claim 1, wherein a router is switched between a the communication network and the communication master.

9. The solar system as claimed in claim 8, wherein the solar inverters of the first part and the solar inverters of the further part are identical in construction.

10. The solar system as claimed in claim 1, wherein the solar inverters of the first part and the solar inverters of the further part are identical in construction.

11. A method of operating a solar system having a communication structure, comprising:
providing a communication structure for at least two solar inverters, having communication connections to connect the solar inverters to a communication network, wherein a first part of the solar inverters is connected via a LAN interface to the communication network and wherein a further part of the solar inverters is connected to the first part via serial interfaces;
collecting all data transferred from the communication network via the LAN interfaces to the solar inverters, embodied as communication masters, by these units;
sending the data in accordance with an address assignment to the solar inverters embodied as communication slaves;
retrieving the data of the solar inverters embodied as communication slaves by the solar inverters embodied as communication masters; and
sending the data via the LAN interface to a node in the communication network.

12. The method as claimed in claim 11, wherein in normal operation all data of the communication slaves assigned to a communication master is handled via these communication masters, wherein on failure of this communication master all data is handled via a standby communication master.

13. A method for operating a solar system having a communication structure, comprising:
providing a communication structure for at least two solar inverters, having communication connections to connect the solar inverters to a communication network, wherein a first part of the solar inverters is connected via a LAN interface to the communication network and wherein a further part of the solar inverters is connected to the first part via serial interfaces;
forwarding all data in accordance with an address assignment from the communication network via the solar inverters embodied as communication masters to the solar inverters embodied as communication slaves; and forwarding the data sent from the solar inverters embodied as communication slaves via the assigned solar inverters embodied as communication masters to a node in the communication network.

14. The method as claimed in claim 13, wherein in normal operation all data of the communication slaves assigned to a communication master is handled via these communication masters, wherein on failure of this communication master all data is handled via a standby communication master.

* * * * *